(12) United States Patent
Currie et al.

(10) Patent No.: US 10,156,840 B2
(45) Date of Patent: *Dec. 18, 2018

(54) PROCESS FOR THE MANUFACTURE OF CUSTOM OPTICAL ELEMENTS

(71) Applicant: PowerPhotonic Ltd., Dalgety Bay (GB)

(72) Inventors: Matthew Oren Currie, Edinburgh (GB); Simon Clovis Younger, Dalgety Bay (GB); Roy McBride, Lochgelly (GB)

(73) Assignee: POWERPHOTONIC, LTD. (GB)

(*) Notice: Subject to any disclaimer, the term of this patent is extended or adjusted under 35 U.S.C. 154(b) by 0 days.

This patent is subject to a terminal disclaimer.

(21) Appl. No.: 15/686,327

(22) Filed: Aug. 25, 2017

(65) Prior Publication Data

US 2017/0371324 A1    Dec. 28, 2017

Related U.S. Application Data

(63) Continuation of application No. 14/169,336, filed on Jan. 31, 2014, now Pat. No. 9,760,084.

(30) Foreign Application Priority Data

Feb. 4, 2013  (GB) ................................. 1301964.1

(51) Int. Cl.
*G06F 19/00*    (2018.01)
*G05B 19/418*   (2006.01)

(52) U.S. Cl.
CPC ............ *G05B 19/41865* (2013.01); *B81C 2201/0143* (2013.01); *Y02P 90/20* (2015.11); *Y02P 90/26* (2015.11); *Y10S 977/889* (2013.01)

(58) Field of Classification Search
CPC ........ G05B 19/41865; G05B 19/41885; G05B 19/4097; G06F 17/5081; G06F 17/227; B81C 2201/0143; G06Q 30/02; G06Q 10/00; G02B 6/12; Y10S 977/889; B22C 9/04; B82Y 20/00
See application file for complete search history.

(56) References Cited

U.S. PATENT DOCUMENTS

| | | |
|---|---|---|
| 5,914,889 A | 6/1999 | Cohen |
| 6,731,991 B1 | 5/2004 | Michalski |
| 2004/0075809 A1 | 4/2004 | Wildsmith |
| 2005/0011873 A1 | 1/2005 | Withford |
| 2006/0041840 A1 | 2/2006 | Blair |
| 2006/0167758 A1 | 7/2006 | Yancy |
| 2009/0106669 A1 | 4/2009 | Winkler |
| 2009/0144686 A1 | 6/2009 | Lensing |
| 2009/0210350 A1 | 8/2009 | Orre |
| 2010/0057237 A1 | 3/2010 | Kettaneh |
| 2010/0181332 A1 | 7/2010 | Wang |

(Continued)

FOREIGN PATENT DOCUMENTS

EP    2590114 A1    5/2013

*Primary Examiner* — Tuan A Vu
(74) *Attorney, Agent, or Firm* — Law Office of Jesse D. Lambert, LLC

(57) ABSTRACT

A process for the manufacture of custom freeform optical elements utilising parameterised modelling. A system for the automatic manufacture of a custom optical element is also described with the manufacturing being by laser micromachining. The process and system allow customers to specify and order via a web interface and so reduce engineering time, overhead and cost.

9 Claims, 3 Drawing Sheets

(56) References Cited

U.S. PATENT DOCUMENTS

2011/0189440 A1 8/2011 Appleby
2011/0222019 A1 9/2011 Suzuki
2014/0002799 A1 1/2014 Wildsmith

PROCESS FOR THE MANUFACTURE OF CUSTOM OPTICAL ELEMENTS

The present invention relates to manufacturing optical elements and more particularly to the manufacture of custom freeform optical elements. More specifically, the present invention relates no an improved method for optical element manufacture utilising parameterised modelling to allow customers to specify and order via a web interface and so reduce engineering time, overhead and cost.

In constructing an optical system such as a high power diode laser optical elements are required to manipulate the beams and provide a desired output. While some conventional optics, these being plane optics (prisms, windows, flats and wedges), lenses (spherical, aspherical, cylindrical and acylindrical forms) and mirrors exist as catalogue items it is more typical that the customer will supply drawings and specifications to the vendor. Subsequently a price is agreed and the vendor manufactures the optical element to the customer's specification.

With the increase in laser specifications and application areas, more advanced optical components are being designed. For example, US2012/140334 to the present Applicant's describes a freeform micro-optical element being a fast axis collimator array for use with a high power diode laser having diode bars of emitters which are arranged in stacks providing a two-dimensional array of emitters. The diode bars are typically fabricated with 25 emitters of 200 μm width along a 10 mm bar of semiconductor, on typically 1.8 mm pitch. To usefully use the output, each beam from each emitter requires to be collimated. The micro-optical element for use with this laser diode bar stack, provides an element comprising a plurality of fast-axis collimators to match the plurality of emitters, formed as a monolithic two-dimensional array. In this way, the array dimensions are matched to the number of emitters and a manufacturer needs only to mount a single optical element at the end of the laser diode bars, consequently reducing the potential for misalignment while increasing the speed of construction. As the dimensions of the element are approximately 1 $cm^2$, the element is also easier to handle than multiple discrete lenses which are used in the prior art at each emitter of bar.

The advancements in laser micro-machining have now made such freeform micro-optical elements accessible as a micro-optical element is produced which avoids the tooling or mask writing steps of alternative techniques and provides for faster fabrication. A laser micro-machining technique is described in US 2012/0140334 and US 2012/0298650 to the present Applicant's. In this method of manufacturing a micro-optical element, a laser is translated over a fused silica substrate to ablate portions of the substrate in a shot-by-shot raster regime. Thus lens shapes can be created on the surface of the substrate. Further, by melting the surface of the silica in zones greater than the raster pitch, the residual pattern of the raster is removed and a smooth, polished surface is achieved. This step can also be achieved rapidly and provides a higher standard of smoothing than the mechanical polishing techniques used in conventional optical fabrication.

While the Applicant's can manufacture to their own specifications easily, the process becomes more difficult when a customer wishes the Applicant's, as vendors, to fabricate a new freeform optical design. Currently, a specification of the customer optic requirement is obtained and then assessed to see whether their requirement is achievable with the current manufacturing process. The vendor may need to carry out additional optical design and analysis as required to see if the required design is achievable. For example, the customer may specify a number of lens shapes over a total width of the element. Calculations must then be done to determine if the resulting pitch will result in troughs between lens shapes being smaller than the resolution obtainable in laser micro-machining.

If the customer optic requirement is not achievable with existing processes, the vendor must assess whether a design cycle would enable a new process to allow manufacture of the optic required. The vendor also needs to establish test requirements for confirming acceptable performance of the finished optic. At this stage the vendor interfaces with the customer to allow them to either provide: design data in a format suitable to enable manufacture of the optic; data specifying optical functionality sufficient to enable design of the optic; or, measurement data sufficient to enable design of the optic.

The vendor can then undertake the redesign and communicate this back to the customer. This may be an iterative process to ensure that the customer gets an optic which will be fit for purpose and the vendor can manufacture the optical element using the laser micro-machining process. It is not unusual for the vendor to have to visit the customer's site and make further measurements on the customers system, such as determining the trajectory of each beam from an array of emitters in a high power laser diode stack as the emitters are not uniformly aligned.

The vendor then designs the optic and the design must be reviewed to determine whether it can be fabricated in accordance with the required specification, communicating with the customer as required.

The next stage is for the vendor to fabricate a trial optic and measure its form error (the deviation in measured surface form from designed surface form) to ensure the part will meet the agreed upon specification. If the optic does not meet the specification, the vendor needs to define a set of adjustments to the fabrication instructions in order to reduce the form error. They then repeat the cycle of fabrication, test, and adjust until the optic meets the specification.

Once the specification is met, which has to be confirmed by undertaking the tests formulated earlier, the vendor then fabricates the number of production optics required by the customer. The parts are then AR coated and diced into a custom shape, if required. Following inspection and yield of the final parts, they can be packaged and delivered to the customer.

The major disadvantage in this approach is that because varying levels of engineering work are required between jobs, the final price per optic is not standardised; meaning that human input is typically required to price a job and indeed, the job cannot be priced until an amount of man hours has already been committed.

The main disadvantage to the vendor is that they must expend significant engineering time and production overhead both to define the parts and to enable manufacture of the parts within specification. There is a significant overhead in communication with the customer from initial inquiry to delivery of parts. The level of development resource required may be unclear at the outset, adding to cost and commercial risk.

The main disadvantage to the customer is that they must expend significant engineering time in communicating their requirements with the vendor. The level of engineering resource required to do this may be unclear at the outset, leading to reluctance on the part of the customer to commit resource to an uncertain outcome. Also, as pricing depends on the level of engineering effort expended by the vendor, the customer must expend considerable effort before knowing whether the part can be manufactured, and whether the job will have an acceptable price.

Consequently, specification and manufacture of freeform optical components typically requires significantly higher engineering input than for conventional optics, the vendors of freeform optical components typically charge correspondingly high levels of NRE, often making the manufacture of prototype parts prohibitively expensive.

It is therefore an object of the present invention to provide a process for the manufacture of custom optical elements which mitigates at least some of the disadvantages of the prior art.

According to a first aspect of the present invention there is provided a process for the manufacture of a custom optical element, the process comprising the steps:
  a) providing a set of optical design guidelines and file format over a web-interface;
  b) inputting an optical design in the file format via the web-interface;
  c) applying a checking routine to determine if the optical design meets the guidelines and manufacturing limitations;
  d) altering the design to the extent required to provide a conforming design which meets the guidelines and the manufacturing limitations;
  e) displaying the conforming design over the web-interface;
  f) ordering at least one optical element in the conforming design; and
  g) manufacturing the optical element(s) in the conforming design.

In this way, an automatic process is provided which offers a choice from a variation of adjustments to an optical design in order to turn a design that does not comply with design guidelines into a part that satisfies these design guidelines.

The cost to the vendor is reduced by removing the need for engineering input into the design and fabrication process, the cost of manufacture is both reduced and made predictable. This allows the vendor to offer complex, freeform optics for a low and fixed price. Lead time is reduced and made predictable for similar reasons.

The cost to the customer is also reduced provided the customer has the design capability to specify the optic according to the guidelines, the customer's internal costs are reduced as they do not need to engage in time consuming communication with the vendor, the overheaded cost of which can easily exceed the purchase order value for prototype parts. Also, certainty of price and lead time make the customer far more likely to place an order.

The vendor can take orders from new customers with greatly reduced cost of sales, which allows for the vendor to expand its market share to include customers that previously were unobtainable.

Additionally, the manufacturing limitations can be hidden from the customer so that they do not need to have access to proprietary and confidential information regarding the manufacturing process.

Preferably, step (d) includes providing a plurality of conforming designs. In this way a customer can choose from a set of proposed designs, so that if the first conforming design does not meet their requirements, they do not have to design and input a new optical design.

Preferably, the optical design is displayed over the web-interface. In this way, a customer can see that they have input the design in the correct file format.

Preferably, a specification to which a conforming design will be tested and/or inspected is provided in step (a). In this way, the customer can be assured that a manufactured optical element will meet their requirements.

Preferably, the file format is one which involves sampling an optical surface, according to the optical design, with a grid in order to describe the optical surface to an external computer program with sufficient resolution. In this way, the formatted file can foe sent directly to and used directly in the manufacturing process. In an embodiment the manufacturing process is laser micro-machining. In this way, the formatted file may contain a grid of data which values represent the depth of ablation of the surface of a substrate to provide the optical design.

Preferably the process includes a step of making payment for the optical elements via the web-interface. In this way, the process can be used as an on-line ordering and payment system.

Preferably, steps (c) and (d) are automated, by the provision of computer programs which operate on the input optical design file. Alternatively, steps (c) and (d) may be performed by an engineer, which will still reduce the process time as their will be no requirement for customer interaction.

Preferably also, the process includes the steps of adding optional specifications to the optical design. For example, the choice of having an anti-reflective coating applied to the optical element can be given with the coating being applied during manufacture.

According to a second aspect of the present invention there is provided a system for the automatic manufacture of a custom optical element comprising: a first module including a web-interface, data storage means, data processing means and data display means; an input optical design being a file containing data referenced to a grid which describes a surface in three dimensions; and an optical element manufacturing process; wherein a set of optical design guidelines and a set of manufacturing limitations are stored in the data storage means and accessed by the data processor to check against the input optical design and generate one or more alternative optical designs which meet the guidelines and limitations if the input optical design does not, each optical design being displayed by the display means over the web-interface and a selected optical design being transferred as an input file to control the manufacturing process and produce at least one optical element to the selected optical design.

In this way, an automatic system is provided which offers a choice from a variation of adjustments to an optical design in order to turn a design that does not comply with design guidelines into a part that satisfies these design guidelines and then to manufacture said design as an optical element.

Preferably, the manufacturing process is a laser micro-machining facility. More preferably, the laser micro-machining facility melts and ablates a fused silica substrate to create the optical element.

An embodiment of the present invention will now be described, by way only, with reference to the accompanying drawings, of which:

Figure 2:
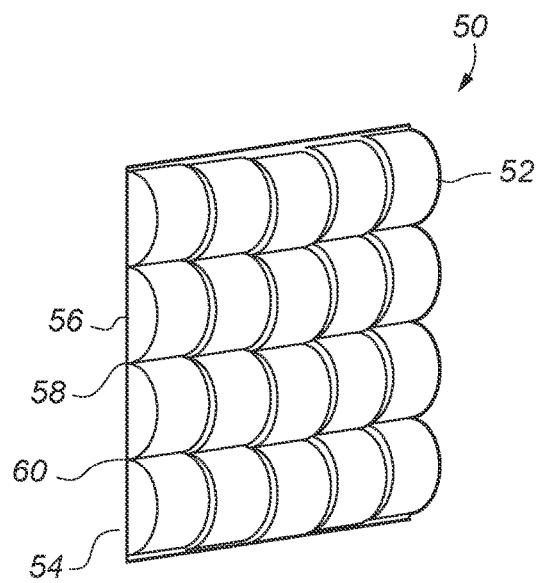
FIG. 2 is an illustration of an optical element to an input optical design according to an embodiment of the present invention.
Figures 3A, 3B:
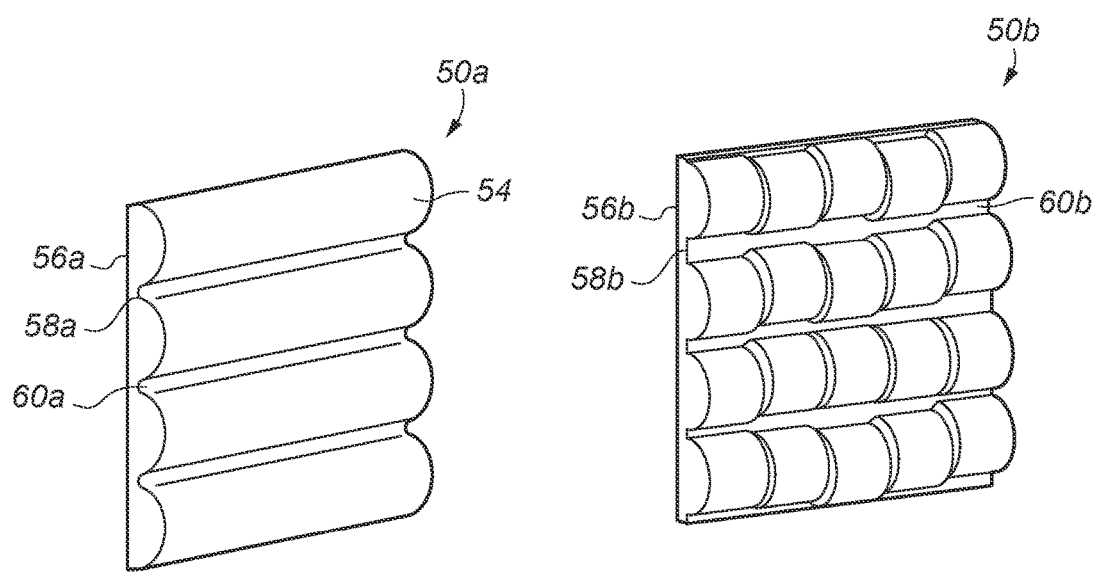
Figure 4:
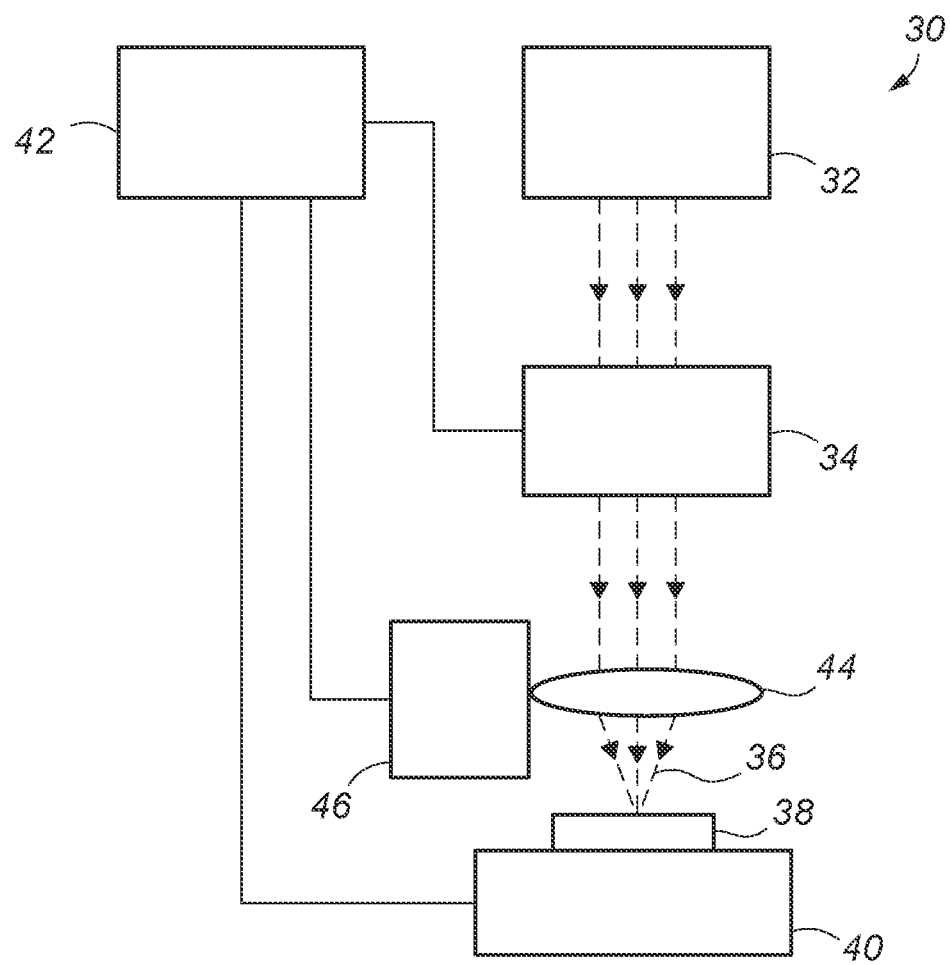

FIGS. 3(*a*) and (*b*) are illustrations of the optical element of FIG. 2 with customised optical designs according to an embodiment of the present invention; and FIG. 4 is a schematic illustration of components and steps in manufacturing a micro-optical element using laser micromachining according to an embodiment of the present invention.

In order to assist in the description of the invention, we shall consider an optical element for the process. This is by way of example only and should not be considered to limit the scope of the invention in any way.

Figure 1:
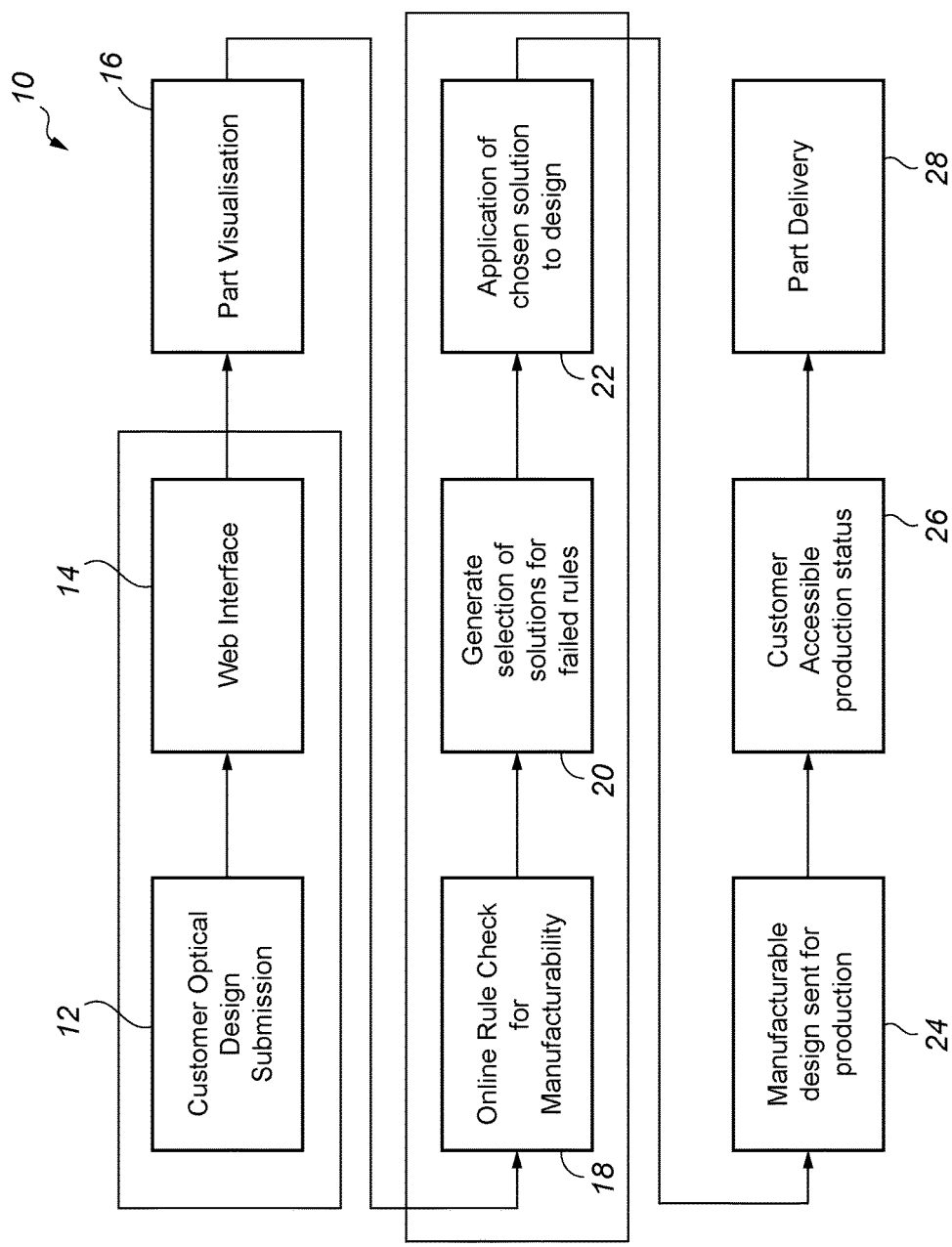
FIG. 1 is a flow chart illustrating steps in a process for the manufacture of a custom optical element, according to an embodiment of the present invention.

Referring initially to FIG. 1 of the drawings, there is illustrated a process, generally indicated by reference numeral 10, for the manufacture of a custom optical element according to an embodiment of the present invention.

The first step in the process is the customer optical design submission. Here the customer's engineers define an optical design to meet their system requirements. In this example, the customer's system is a high power diode laser. High power diode lasers are used in applications such as pumping of solid state lasers and directly in materials processing. In order to achieve the required power levels, diode bars of emitters are arranged in stacks providing a two-dimensional array of emitters. The diode bars are typically fabricated with 25 emitters of 200 μm width along a 10 mm bar of semiconductor, which is then solder-bonded to a micro-channel watercooled heat sink. Commercially produced units, emitting 50-100 W per bar, are stacked on typically 1.8 mm pitch to build up a total laser power of 500-1000 W. For our customer, their arrangement has four diode bars, having five emitters along each bar.

While such an arrangement produces high power, the beam quality is unacceptable. For high-brightness applications and also for some medium-brightness applications, by which we mean those with divergence well below the ex-facet divergence but well above the diffraction limit, the beam must be, at least, collimated. Manufacturers typically attach an individual fast-axis collimator to each bar. The fast-axis collimator is a plano-cylindrical lens which is used to provide low aberration collimation for the high numerical aperture fast-axis beam. The fast-axis refers to the vertical axis where the beam diverges quickly from art emitter region in the μm range. This is in contrast to the slow-axis, parallel to the face of the bars, where the emitter region is more typically 100 μm.

For many applications, the resultant beam quality is still poor. The disadvantages in using a plano-cylindrical lens at along each bar are apparent as: the cylindrical lens for each bar introduces angular aberrations giving a local radiance loss of a factor of 2 to 3; the collimation lens cannot be correctly positioned for all points along the bar as a result of the "smile" effect, where the semiconductor bar is bent by differential expansion during solder bonding, resulting in beams with variable pointing direction; and errors in attaching the fast-axis collimator to the heat sink with the required positional accuracy also degrade the angular spectrum of the emitted light. Additionally, in many applications of the laser diode stacks, subsequent aperture filling, beam shaping and beam combining optics are required and, due to errors in ray angles from the fast-axis collimator, the design and effectiveness of subsequent beam conditioning optics is compromised.

Due to the difficulty in positioning discrete collimators at each emitter and the inability of a plano-acylindrical lens positioned along each bar to correct for smile and facet bending, US 2012/0140334 to the present Applicant's discloses a micro-optical element for use with an edge-emitting laser diode bar stack which is of single piece construction. The element comprises a plurality of spaced apart fast-axis collimators formed as a monolithic array, wherein the spacing between the collimators in the fast-axis varies across the micro-optic element. Such a monolithic array provides a surface of lenses with properties tailored to the geometry of the laser diode stack. US 2012/0140334 is incorporated herein by reference. This monolithic fast axis collimator array is what the customer desires.

The customer's engineers will consult documentation available on the vendor's website that describes the product, the design guidelines and file format, and the specification to which the part will be inspected. Using these guidelines, the customer's engineers define an optical design to meet their system requirements. This design can be done mathematically or numerically using programs such as MATLAB or Mathematical, with optical design packages such as ZEMAX or CODE V, or with simpler tools such as a spread sheet. The customer then saves their optical design into a portable file format defined by the vendor. This involves sampling the optical surface with a specific grid in order to describe the surface to an external program with appropriate resolution.

Via the web-interface 14, the customer then uploads the design file to the website in order to submit it for manufacture. A part visualisation step 16 may be made here, where the customer is presented with an image showing what the optical element 50, made to their design, would look like. This three-dimensional representation is shown in FIG. 2.

FIG. 2 illustrates an optical element 50 being a monolithic fast axis collimator array. The customer's engineers have designed twenty plano-cylinder lenses 52 on a surface 54. Each lens 52 is designed to collimate the beam from each of the twenty five emitters on their high power diode laser. Each lens 52 is orientated to intercept and correct the trajectory of the beam from each emitter, so that a parallel array of collimated beams will exit the element 50, in use. The visualisation 16 can be used by the engineers to confirm that they have correctly input the data in the correct file format.

The vendor's then has a stored model of a fast axis collimator array and compares this to the input design 50. An initial check is performed to see that it meets the guidelines, which in this case may be that a two-dimensional array of plano-cylindrical lenses will represent a monolithic fast axis collimator array. An on-line rule check for manufacturability 18 is then performed. In this step, the vendor can hold data on the manufacturing limitations and techniques used, which are not accessible to the customer. In this way, the vendor does not reveal proprietary or confidential information about the manufacturing process which may, if published, allow others to offer the manufacturing process.

For this example and as an embodiment of the present invention, the manufacturing process is a laser micro-machining technique. The laser micro-machining technique is described in US 2012/0140334 and US 2012/0298650 to the present Applicant's, which are incorporated herein by reference.

Reference is now made to FIG. 4 of the drawings which illustrates the components of a laser micro-machining process, generally indicated by reference numeral 30, for creating a micro-optical element 50 for use with a laser diode bar stack. An RF excited $CO_2$ laser 32 is arranged before an acousto-optic modulator (AOM) 34. Various optical elements direct the output beam 36 to a silica substrate 38 upon which the lens shapes 52 will be machined.

The fused silica substrate 38 (typically a piece of flat, parallel-sided fused silica 1 mm thick) is mounted upon an XY translation stage 40, which is computer 42 controlled to move in steps of 100 nm in the two dimensions. A focussing lens 44 mounted on a computer controlled Z stage 46, focuses the beam 36 onto the substrate, a required depth to ablate the silica. The computer 42 moves the stages 40,46 in a raster configuration so that controlled ablation, by shot-by-shot laser writing, of the silica 38 is achieved to create the required lens shapes 52 to form the array of fast-axis collimators.

In order to achieve laser pulses of equal energy, high stability and fixed on a single laser line, a process of timed signals, is followed. The stage 40 controller 42 generates a position-synchronised output (PSO) trigger when the stage 40 passes predefined locations. This is a standard feature on many commercial XY stages and controllers. These trigger signals are used to fire the laser 32. Advantageously, the AOM 34 window opens at time which ensures that the spectrum has settled in the delivered pulse. Pulse energy is kept constant by feedback control via a detector signal from a partially reflected beam being fed to a pulse energy dispenser for a pulse energy target.

Typically the spot on the substrate 38 corresponds to a Gaussian beam waist such that the spot profile at the surface to be machined is circular Gaussian. The beam radius may be on the order of approximately 25 μm.

The time needed to machine each lens shape 52 is approximately 10 minutes. The entire element 50 can thus be manufactured in a relative short amount of time providing the ability to undertake rapid prototyping.

The as-machined surface 52 of the element 10 is then subjected to a rectangular mesh of shots. The mesh is selected as 2 μm by 10 μm and the laser selected to give fluencies of approximately 5 to 8 J/cm$^2$. A melt zone of diameter approximately 220 μm is thus created which removes the residual pattern of the raster and smoothes the surface 52. It is the same system, as described with reference to FIG. 4, which performs the smoothing and thus the substrate 38 does not require to be moved between the machining and polishing steps.

An on-line rule check for manufacturability 18 checks the optical design 50 for compatibility with the manufacturing process. It then either confirms that the optical design can be directly manufactured to specification, or gives feedback that it cannot. In the present example, we can consider that the check found that the troughs 60 between the lens forms 52, where too narrow and not achievable by the laser machining process. Additionally, the thickness of substrate left between the base 58 of the troughs 60 and the back surface 58 would produce an element which would be too fragile. Thus the on-line check for manufacturability 18 fails.

The system then provides routines to generate a selection of solutions for the failed rules or conditions 20. In the present example, two alternative designs are proposed. These are illustrated in FIGS. 3(a) and 3(b). In the element 50a, the troughs 60a have been widened and made shallower. This increases the thickness between the base 58a and the back surface 56a. The lens forms 52 have been combined to form a single plano-cylindrical lens 54 for each laser bar. This has been done as the radius of curvature of the largest lens 52 has been used to fit over the emitters. In this design the correction of emitter misalignment has been traded against the numerical aperture for each beam. The second alternative design, element 50b, has maintained the individual plano-cylindrical lenses, but at reduced dimensions to provide the widened trough 60b. In the element 50b, the troughs 60b have also been made shallower. This increases the thickness between the base 58b and the back surface 56b. The two alternative design solutions 50a,50b are checked again 18 to confirm that the new surfaces conform to the guidelines and the manufacturability criteria.

The alternative designs 50a,b are generated visually and together with data on their specification and performance are presented to the customer 20 over the web-interface. The customer is given the option of choosing one of the design alternatives 22 once they have checked that one of these will suit their requirements. Alternatively they can change the design and resubmit. Once the customer has chosen the design, other options can be offered such as an AR coating.

With the design selected (in this case 50b), the customer can order the required number of optical elements 50b through the website and pay either by credit card with a standard e-commerce interface or by applying/paying through an account with the vendor.

In an automated process, the original or modified design 50b files are sent to the laser micro-machining system 30, where they are used to program the fabrication process for the number of optical elements ordered 24. As the system is computerised, the customer can have access to the production status 26 at any time. On completion, the fused silica optical element will have a surface matching that of the original design 50b. The elements 50b may be AR coated if the option has been selected. The final parts are then inspected and tested to ensure they meet the test protocol presented at the start of the process 12. The optical element(s) is then delivered to the customer 28.

Thus, the process 10 of the present invention significantly simplifies the process of obtaining a new customer, as well as simplifying the process for existing customers to obtain new bespoke optical parts. By offering a standardised specification, manufacturing process, product layout and data exchange format, the vendor is able to eliminate many of the steps required by the existing prior art process. The process is executed primarily through a website interface and aims to minimise the amount of time spent interacting with the customer.

The principle advantage of the present invention is that it provides a process and system for the manufacture of custom freeform optical elements where the file the customer submits is the file directly used by the laser fabrication system in order to produce the optical element; but the level of standardisation in the process means the customer does not require any knowledge of how the laser fabrication process works. In essence this means the customer is able to exactly specify the surface they desire and the vendor's process manufactures that surface (within specification and assuming guidelines have been adhered to) with a high level of automation (i.e. without the need for anyone at the vendors to exercise human judgement over the specific design or the process used), minimising engineering time and eliminating any iterative fabrication, test, and adjust cycles. Humans may still be used for standard handling and inspection steps, but these are standard across all products and are not product-specific.

A further advantage of the present invention is that it provides a process and system for the manufacture of custom freeform optical elements which automatically checks whether the design fits within this process capability and where it does not, automatically offers variations to the design that do fit within this process capability. Consequently, the customer can rapidly arrive at a design that they know will be made to specification and choose between alternatives that best suit their requirements.

It will be appreciated by those skilled in the art that various modifications may be made to the invention herein described without departing from the scope thereof. For example, the guidelines may suggest typical optical elements for the customer to input their requirements. Though the process assumes that the customers have significant optical design expertise, the process could include links to optical design packages for those of less skill in the art. Additionally, the process could include ray optic illustrations of the expected performance of the optical element to further assist a customer in making sure that the design selected best meets their requirements. Further also, the process may offer other processes such as amending the design to correct for wavefront error that needs correction. These add-ons may require further data from the customer and engineering input from the vendor, but by interacting over a web-interface the steps are automated, clear and reduce the amount of customer interaction time.

We claim:

1. A process for the manufacture of a custom freeform optical element, comprising the steps of:
   a) creating a set of optical element design guidelines and a file format for a custom freeform optical element, storing said guidelines and said file format on a processor, and providing said guidelines and said file format over a web-interface to a customer;
   b) inputting said customer's desired optical element design and transmitting said customer's inputted desired optical element design in the file format, via the web-interface, from said customer to a vendor;
   c) applying, by a computer of said vendor, a computerized checking routine to compare said desired optical element design with said optical element design guidelines to determine if said desired optical element design meets said optical design guidelines and an applicable set of manufacturing limitations;
   d) employing, by a processor, parameterised modelling to alter the desired optical element design to the extent required to provide a conforming optical element design which meets said optical element design guidelines and said applicable set of manufacturing limitations;
   e) transmitting and displaying said conforming optical element design over the web-interface, to said customer;
   f) receiving an order from said customer over the web-interface for the custom freeform optical element, in the conforming optical element design; and
   g) manufacturing the custom freeform optical element in fused silica to the conforming optical element design and without the manufacture of a trial optical element, by the steps of:
      mounting a fused silica substrate on a computer controlled XY stage;
      using a computer controlled focussing lens on a z stage to focus a laser beam onto the substrate a required depth to ablate the substrate;
      moving, via said computer of said vendor, the stages in a raster configuration to provide controlled ablation, by shot-by-shot laser writing, of the fused silica substrate;
      wherein said required depth is determined from the file format of the conforming optical element design which contains a grid of data whose values represent the depth of ablation of the surface of a substrate to provide the conforming optical element design.

2. A process according to claim 1 wherein step (d) includes providing a plurality of conforming optical element designs.

3. A process according to claim 1 wherein the desired optical element design is displayed over the web-interface.

4. A process according to claim 1 wherein a specification to which a conforming optical element design will be tested and/or inspected is provided in step (a).

5. A process according to claim 1 wherein the file format is one which involves sampling an optical surface, according to the desired optical element design, with a grid in order to describe the optical element surface to an external computer program with sufficient resolution.

6. A process according to claim 1 wherein the manufacturing process is laser micro-machining.

7. A process according to claim 1 wherein the process includes a step of making payment for the optical elements via the web-interface.

8. A process according to claim 1 wherein steps (c) and (d) are automated, by the provision of computer programs which operate on the input desired optical element design file.

9. A process according to claim 1 wherein the process includes the steps of adding optional specifications to the desired optical element design.

* * * * *